(12) United States Patent
Neidengard

(10) Patent No.: US 7,667,507 B2
(45) Date of Patent: Feb. 23, 2010

(54) EDGE-TIMING ADJUSTMENT CIRCUIT

(75) Inventor: Mark L. Neidengard, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 12/146,663

(22) Filed: Jun. 26, 2008

(65) Prior Publication Data

US 2009/0322393 A1  Dec. 31, 2009

(51) Int. Cl.
*H03L 7/06* (2006.01)
(52) U.S. Cl. .................. 327/155; 327/166; 327/170
(58) Field of Classification Search .......... 327/141, 327/149, 155, 158, 165, 166, 170
See application file for complete search history.

(56) References Cited

U.S. PATENT DOCUMENTS

| | | | | |
|---|---|---|---|---|
| 5,552,726 A * | 9/1996 | Wichman et al. | ........... | 327/149 |
| 6,100,733 A * | 8/2000 | Dortu et al. | .................. | 327/149 |
| 6,518,808 B2 * | 2/2003 | Shimoda | ....................... | 327/172 |
| 6,853,225 B2 * | 2/2005 | Lee | .............................. | 327/158 |
| 7,088,159 B2 * | 8/2006 | Kwak et al. | .................. | 327/161 |
| 7,428,284 B2 * | 9/2008 | Lin | ............................. | 375/355 |
| 7,598,783 B2 * | 10/2009 | Shin et al. | .................... | 327/158 |
| 7,598,784 B2 * | 10/2009 | Hunter | ........................ | 327/170 |
| 2009/0153202 A1 * | 6/2009 | Yagi | ............................. | 327/141 |

* cited by examiner

*Primary Examiner*—Lincoln Donovan
*Assistant Examiner*—William Hernandez
(74) *Attorney, Agent, or Firm*—Buckley, Maschoff & Talwalkar LLC

(57) ABSTRACT

According to some embodiments, a method and system are provided to receive a clock input at a first clock adjustment tuner, receive the clock input at a second clock adjustment tuner, output a tuned inverted rising clock signal via the first clock adjustment tuner, output a tuned inverted falling clock signal via the second clock adjustment tuner, receive the inverted rising clock signal and the inverted falling clock signal at a clock synchronizer, output a synchronized tuned clock signal via the clock synchronizer, receive the synchronized tuned clock signal at a third clock adjustment tuner, and output a tuned clock signal. The first clock adjustment tuner and the second clock adjustment tuner provide coarser adjustments than the third clock adjustment tuner.

9 Claims, 4 Drawing Sheets

700

```
┌─────────────────────────────────────────────────────────────────────────┐
│         Receive a clock input at a first clock adjustment tuner         │
│                                                                     701 │
└─────────────────────────────────────────────────────────────────────────┘
                                    │
                                    ▼
┌─────────────────────────────────────────────────────────────────────────┐
│         Receive the clock input at a second clock adjustment tuner      │
│                                                                     702 │
└─────────────────────────────────────────────────────────────────────────┘
                                    │
                                    ▼
┌─────────────────────────────────────────────────────────────────────────┐
│   Output a tuned inverted rising clock signal via the first clock adjustment tuner │
│                                                                     703 │
└─────────────────────────────────────────────────────────────────────────┘
                                    │
                                    ▼
┌─────────────────────────────────────────────────────────────────────────┐
│  Output a tuned inverted falling clock signal via the second clock adjustment tuner │
│                                                                     704 │
└─────────────────────────────────────────────────────────────────────────┘
                                    │
                                    ▼
┌─────────────────────────────────────────────────────────────────────────┐
│  Receive the inverted rising clock signal and the inverted falling clock signal at a clock │
│                               synchronizer                          705 │
└─────────────────────────────────────────────────────────────────────────┘
                                    │
                                    ▼
┌─────────────────────────────────────────────────────────────────────────┐
│         Output a synchronized tuned clock signal via the clock synchronizer │
│                                                                     706 │
└─────────────────────────────────────────────────────────────────────────┘
                                    │
                                    ▼
┌─────────────────────────────────────────────────────────────────────────┐
│    Receive the synchronized tuned clock signal at a third clock adjustment tuner │
│                                                                     707 │
└─────────────────────────────────────────────────────────────────────────┘
                                    │
                                    ▼
┌─────────────────────────────────────────────────────────────────────────┐
│   Output a tuned clock signal, where the first clock adjustment tuner and the second │
│   clock adjustment tuner provide coarser adjustments than the third clock adjustment tuner 708 │
└─────────────────────────────────────────────────────────────────────────┘
```

FIG. 7

EDGE-TIMING ADJUSTMENT CIRCUIT

BACKGROUND

Clock signals comprise both rising and falling edges. A rising edge may rise at a different latency than a falling edge and these differences in latency may be corrected by the use of one or more delay tuners. In conventional systems, large differences between rise and fall latency may require the use of numerous tuners, which may result in a large fixed amount of latency and also an increase in required power.

Some existing commercial designs simply accept the fixed latency penalty of an extended fine delay pipeline. In one instance, a delay fine tuner stage might have twice the fixed latency as variable latency, and a particular product requirement might mandate several stages in series.

BRIEF DESCRIPTION OF THE DRAWINGS

FIG. 7 illustrates a method according to some embodiments.

DETAILED DESCRIPTION

Figure 1:
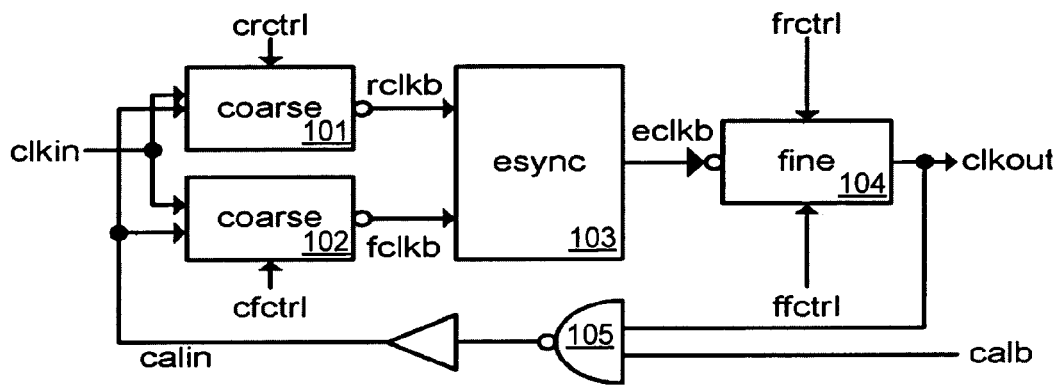
FIG. 1 illustrates an adjustment circuit according to some embodiments.

Referring now to FIG. 1, an embodiment of an adjustment circuit 100 is shown. In some embodiments, FIG. 1 may illustrate an edge timing adjustment circuit that comprises a digital delay element to independently control a rise latency and a fall latency of a clock signal.

The adjustment circuit 100 may comprise a first coarse delay tuner 101 and a second coarse delay tuner 102. In some embodiments, the first coarse delay tuner 101 may be associated with a rising edge of a clock signal and the second coarse delay tuner 102 may be associated with a falling edge of the clock signal. As illustrated, a clock signal may be input into both the first coarse delay tuner 101 and the second coarse delay tuner 102 at substantially the same time. Each coarse delay tuner 101/102 may comprise a control signal input to receive a control signal, as illustrated by a control signal for a falling edge crctrl and a control signal for a rising edge cfctl. Each control signal may provide a code, such as a thermometer code, to indicate an operation associated with a respective coarse delay tuner 101/102, such as, but not limited to, indicating a number of stages to be implemented by each coarse delay tuner 101/102.

Each coarse delay tuner 101/102 may adjust a respective rising edge or falling edge of a clock signal. The first coarse delay tuner 101 may output a rising edge adjusted clock signal rclkb and the second coarse delay tuner 102 may output a falling edge adjusted clock signal fclkb. The rising edge adjusted clock signal and the falling edge adjusted clock signal may each be inverted and input into a clock synchronizer 103.

The clock synchronizer 103 may combine the inverted rising edge adjusted clock signal and the inverted falling edge adjusted clock signal into a combined adjusted clock signal eclkb. Once the inverted rising edge adjusted clock signal and the inverted falling edge adjusted clock signal are combined, the combined adjusted clock signal may be inverted and input into a fine delay tuner 104.

The fine delay tuner 104 may perform smaller (i.e., finer) adjustments to both a rising edge and a falling edge of the combined adjusted clock signal than the adjustments performed by the coarse delay tuners 101/102. The fine delay tuner 104 may receive a first control signal for a rising edge frctrl and a second control signal for a falling edge ffcrtl. Each control signal may provide a thermometer code to indicate an operation associated with the fine delay tuner, such as, but not limited to, indicating a number of stages to use. The fine delay tuner 104 may output a tuned clock signal clkout.

Figure 2:
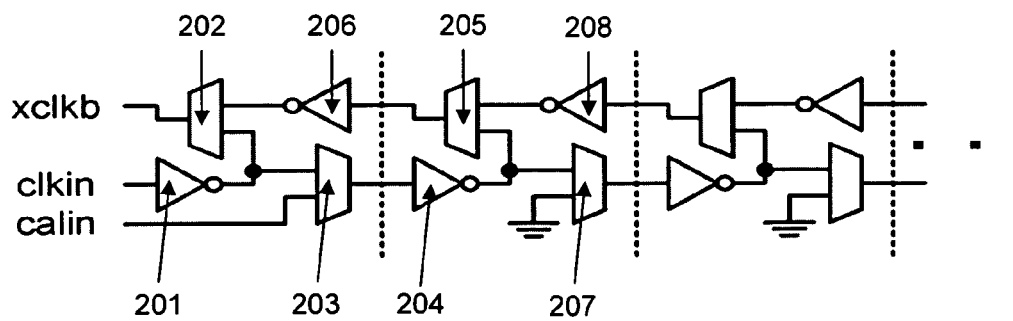
FIG. 2 illustrates a coarse delay tuner according to some embodiments.
Figure 6:
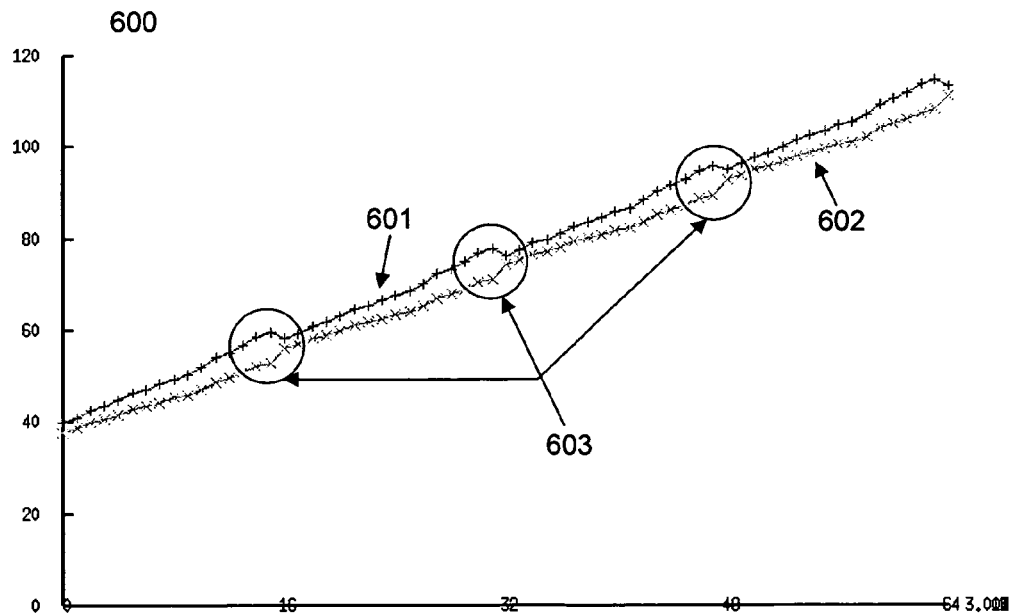
FIG. 6 illustrates a tuning curve according to some embodiments.

In some embodiments, the adjustment circuit 100 may be converted into a ring oscillator. Introduction of an active-low calibration calb signal may be NANDed at NAND gate 105 with the tuned clock signal which may allow a feedback path in FIG. 1 to toggle. A plurality of multiplexers (as shown in FIG. 2), that are included in the first stage of both coarse delay sections, may be configured to pass a calibration signal calin instead of the clkin signal to the rest of the delay line, creating a closed ring oscillator. Since the ring oscillation may include both rising and falling edges, different rise and fall delay settings may be chosen. In some embodiments, a simulated minimum measurable oscillation period may be in a range of approximately 162.3 picoseconds ("ps") (i.e., 6.161 GHz) to 725.7 ps (i.e., 1.378 GHz) under nominal conditions. In some embodiments, an average fine step size may comprise 1.25 ps, which may correspond to a 48 MHz frequency shift at a short delay side, or 2.4 MHz at a long delay side. In some embodiments, data collected at control "roll over" points as illustrated in FIG. 6 may be used to determine capacitance settings as described below.

In some embodiments, adjustment circuit 100 may comprise 16 coarse and 16 fine settings that provide an 8-bit binary control word. A size of fine steps, associated with the 16 fine settings, may be determined by a ganged set of 4-setting variable capacitors. Circuits may be sized such that at a maximum capacitance setting no gaps appear in the tuning curve as a control word "rolls over" from maximum to minimum fine delay as illustrated at roll over points 603 of FIG. 6. The coarse and fine step sizes may be scaled based on a process, voltage and/or temperature. Therefore, appropriate selection of capacitance values may result in a substantially linear tuning curve. In some embodiments the fine delay tuner 104, may be relocated from after the clock synchronizer 103, to before the coarse delay tuners 101 and 102.

Now referring to FIG. 2, an embodiment of a coarse delay tuner 200 is illustrated. As shown, the coarse delay tuner 200 may receive a clock signal clkin and may output an adjusted clock signal xclkb where x comprises either "r" for a rising edge or "f" for a falling edge. The coarse delay tuner 200 may comprise a plurality of stages. In some embodiments, FIG. 2 may illustrate 3 stages of the course delay tuner 200. For example, a first stage may comprise a first inverter 201, a first multiplexer 202, a second multiplexer 203, and a second inverter 206. If a clock signal is to be delayed via only a single stage, a shortest path through the first stage may be used. For example, a shortest path through the first stage may comprise a received clock signal being input into the first inverter 201, then input into the first multiplexer 202, and then finally outputted to the clock synchronizer 103. In this embodiment, a minimum delay would be equal to a time that it takes for the received clock signal to travel through one multiplexer and one inverter.

In some embodiments, two stages of the coarse delay tuner 200 may be required for tuning a clock signal. In this embodiment, a shortest path though the first stage and the second may be used (i.e., a shortest path through two stages). For example, a shortest path through the first stage may comprise the received clock signal being input into the inverter 201, input into the second multiplexer 203, input into the second inverter 204, input into the third multiplexer 205, input into the third inverter 206, input into the first multiplexer 202, and then finally outputted to the clock synchronizer 103. In some embodiments, when three stages of the coarse delay tuner 200 may be required, the clock signal may be input into a fourth multiplexer 207 and a fourth inverter 208.

Figure 3:
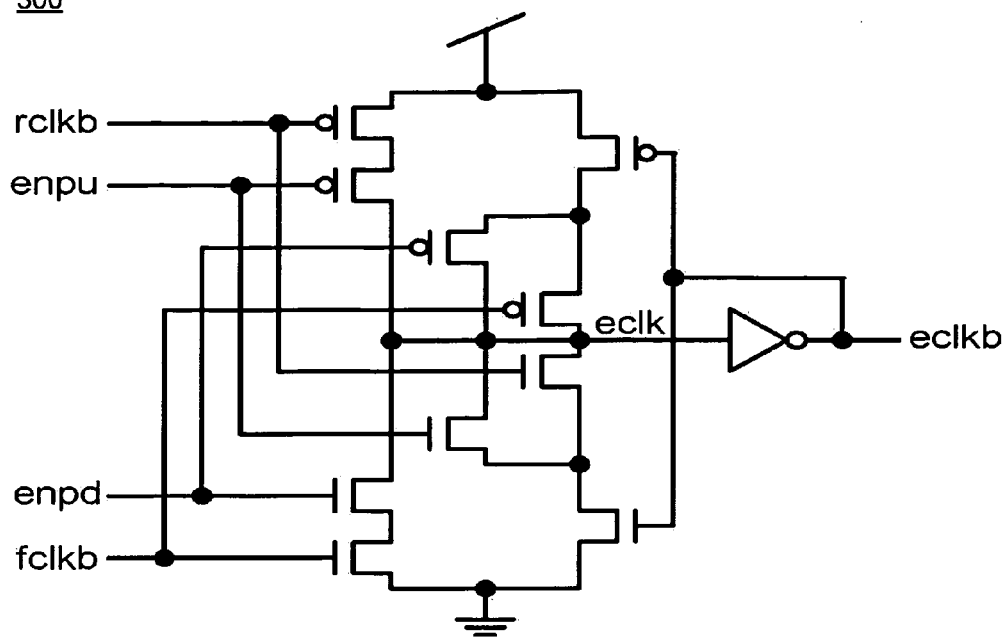
FIG. 3 illustrates a clock synchronizer according to some embodiments.
Figure 5:
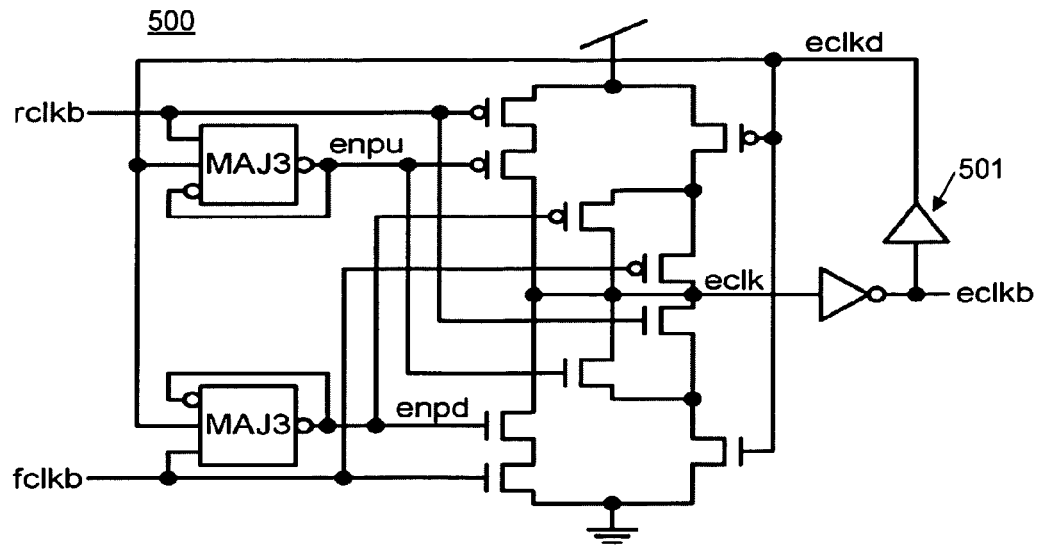
FIG. 5 illustrates a clock synchronizer according to some embodiments.

Now referring to FIG. 3 and FIG. 5, a first embodiment of a clock synchronizer 300 and a second embodiment of a clock synchronizer 500 are illustrated. Each clock synchronizer 300/500 may be used to combine a rising edge adjusted clock signal rclkb and a falling edge adjusted clock signal fclkb into a single combined clock signal. Each clock synchronizer 300/500 may receive a rising edge adjusted clock signal rclkb and a falling edge adjusted clock signal fclkb. The clock synchronizer 300/500 may also comprise an enable pull up signal enpu and an enable pull down signal enpd that may be generated asynchronously. If fclkb is to transition high then this transition may be effective when clkout, as illustrated in FIG. 1, transitions low, or when eclkb transitions high.

When fclkb and eclkb are high, then enpu may be set to low. To raise enpu to high again, eclkb should be transitioned low (i.e., indicating that a pullup took its turn), and also fclkb must have transitioned to low (i.e., allowing only one output transition per input transition). In some embodiments, enpu, and symmetrically enpd, may be generated using inverting Mueller C-elements, where a Mueller C-element may comprise an output that reflects a plurality of inputs when the states of all inputs match. Moreover, an output of a Mueller C-element may remain in this state until each of the plurality of inputs transition to a different state. A two-input Mueller C-element, as described above, may be implemented using a majority-3 (MAJ3) gate. In some embodiments, a MAJ3 gate comprise 3 inputs and a single output. The output may equal a value of a majority of the 3 inputs (e.g., if two inputs=1 then the output is 1 and if two inputs=0 then the output is 0). In some embodiments, each clock synchronizer 300/500 may provide feedback from eclkb to eclk.

In some embodiments, the clock synchronizer 500 may comprise a buffer 501 on the eclkb path to prevent incomplete switching at enpu and enpd. If a rising edge of fclkb and a falling edge of rclkb occurs during a shorter interval than a buffer delay, the clock synchronizer 500 may cause a second transition to wait a full clock cycle which may produce a frequency divide-by-2 behavior.

Figure 4:
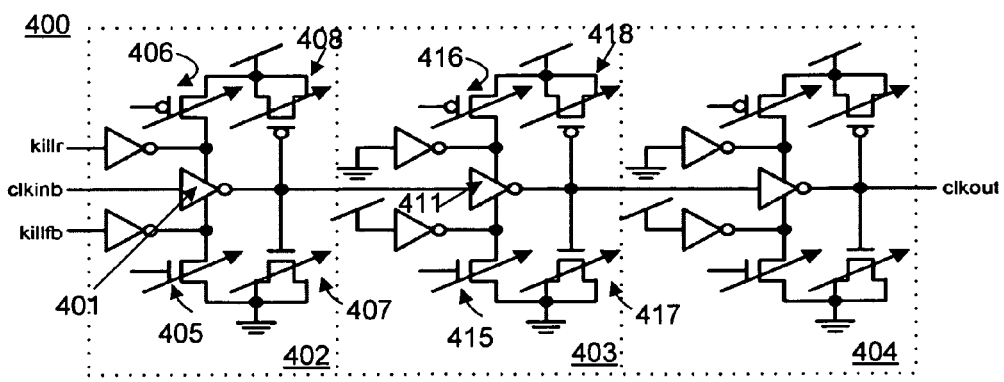
FIG. 4 illustrates a fine delay tuner according to some embodiments.

FIG. 4 illustrates a fine delay tuner 400 according to some embodiments. The fine delay tuner 400 may provide independent control over rise and fall. The fine delay tuner 400 may comprise a delay-insensitive core to coordinate switching activity. In some embodiments, the fine delay tuner may comprise a series of stages and, as illustrated, fine delay tuner 400 may comprise three stages, 402, 403, and 404.

In some embodiments, such as when a single stage 402 is required, the fine delay tuner 400 may receive a combined clock signal clkinb from a clock synchronizer 103 at an inverter 401. The inverter 401 may be coupled to a first transistor 405 and a second transistor 406. The first transistor 405 and the second transistor 406 may be turned on separately or may be turned on in unison to either pull up or pull down the clock signal (i.e., adjust the signal). The first stage of the inverter 401 may further comprise a third transistor 407 and a fourth transistor 408 that may additionally pull up or pull down the clock signal to make finer adjustments (i.e. extra fine) to the clock signal than the first transistor 405 or the second transistor 406. In some embodiments, the fine delay tuner 400 may receive a kill rise killr signal and/or a kill fall killf signal to park a clock signal to prevent toggling input and non-toggling output.

In some embodiments, more than one stage 402/403/404 may be used. If two stages are used, for example, a signal outputted from the first stage 402 will enter the second stage 403. A fifth transistor 415 and a sixth transistor 416 may be turned on separately or may be turned on in unison to either pull up or pull down the clock signal (i.e., adjust the signal). The second stage of a second inverter 411 may further comprise a seventh transistor 417 and an eighth transistor 418 that may additionally pull up or pull down the clock signal to make finer adjustments (i.e. extra fine) to the clock signal than the fifth transistor 415 or the sixth transistor 416.

FIG. 6 illustrates an embodiment of a tuning chart 600. The tuning chart 600 may illustrate roll over points 603 for transitions from fine to coarse 601 and roll over points 603 from fine to extra fine 602 as might be output from fine tuner 104.

Now referring to FIG. 7, an embodiment of a method 700 is illustrated. The method may be executed by a system, such as, but not limited to, the system of FIG. 1. At 701, a clock input is received at a first clock adjustment tuner. The clock input may comprise a clock signal comprising rising and falling edges where a rising edge may rise at a different speed than a falling edge. In some embodiments the first clock adjustment tuner may comprise a coarse delay tuner, such as coarse delay tuner 101. The clock input may be coarsely adjusted based on a falling edge. The coarse delay tuner may receive a control input via a control signal to indicate that the clock input will be adjusted through one or more of a plurality of stages.

At 702, the clock input is received at a second clock adjustment tuner. In some embodiments the first clock adjustment tuner may comprise a coarse delay tuner, such as coarse delay tuner 102. The clock input may be coarsely adjusted based on a rising edge. The coarse delay tuner may receive a control input via a control signal to indicate that the clock input will be adjusted (i.e., delayed) through one or more of a plurality of stages Next, at 703, a tuned inverted rising clock signal is output via the first clock adjustment tuner and at 704, a tuned inverted falling clock signal is output via the second clock adjustment tuner.

The inverted rising clock signal and the inverted falling clock signal are received at a clock synchronizer at 705. The clock synchronizer, such as clock synchronizer 104, may combine the tuned inverted falling clock signal and the inverted rising clock signal.

At 706, a synchronized tuned clock signal is output via the clock synchronizer. In some embodiments the synchronized tuned clock signal may comprise a combination of a tuned inverted falling clock signal and a tuned inverted rising clock signal.

Next, at 707, the synchronized tuned clock signal is received at a third clock adjustment tuner. In some embodiments, the third clock adjustment tuner may comprise a fine tuner, such as fine delay tuner 104. The fine tuner may make adjustments to both a falling edge and a rising edge of the synchronized tuned clock signal.

A tuned clock signal is output at 708, wherein the first clock adjustment tuner and the second clock adjustment tuner provide coarser adjustments than the third clock adjustment tuner.

In some embodiments of method 700 coarse delay adjustments, fine delay adjustments, and clock synchronization may be performed in any order through rearrangement of stages of a system. In some embodiments of method 700 functions such as coarse delay adjustments, fine delay adjustments, and clock synchronization may be physically or logically merged.

Various modifications and changes may be made to the foregoing embodiments without departing from the broader spirit and scope set forth in the appended claims

What is claimed is:

1. A system comprising:
a first clock adjustment tuner to receive a clock input and to output a tuned inverted rising clock signal;
a second clock adjustment tuner to receive the clock input and to output a tuned inverted falling clock signal;
a clock synchronizer to receive the inverted rising clock signal and the inverted falling clock signal and to output a synchronized tuned clock signal; and
a third clock adjustment tuner to receive the synchronized clock signal and to output a tuned clock signal, wherein the first clock adjustment tuner and the second clock adjustment tuner provide coarser adjustments than the third clock adjustment tuner, wherein the first clock adjustment tuner is to further receive a first control signal, wherein the second clock adjustment tuner is to further receive a second control signal, and wherein the third clock adjustment tuner is to further receive a third control signal and a fourth control signal.

2. The system of claim 1, wherein the first control signal provides a thermometer code and the second control signal provides a thermometer code.

3. The system of claim 1, wherein a shortest signal path through the first clock adjustment tuner comprises a single stage, wherein the single stage comprises an inverter and a multiplexer.

4. The system of claim 3, wherein a next shortest path through the first clock adjustment tuner comprises two stages.

5. The system of claim 1, wherein the third clock adjustment tuner comprise a first fine adjustment element associated with inverting the synchronized clock signal and a second fine adjustment element associated with an output of the inverted synchronized clock signal.

6. The system of claim 1, wherein the clock synchronizer comprises a first majority-3 gate and a second majority-3 gate.

7. A method comprising:
receiving a clock input at a first clock adjustment tuner;
receiving the clock input at a second clock adjustment tuner;
outputting a tuned inverted rising clock signal via the first clock adjustment tuner;
outputting a tuned inverted falling clock signal via the second clock adjustment tuner;
receiving the inverted rising clock signal and the inverted falling clock signal at a clock synchronizer;
outputting a synchronized tuned clock signal via the clock synchronizer;
receiving the synchronized tuned clock signal at a third clock adjustment tuner; and
outputting a tuned clock signal, wherein the first clock adjustment tuner and the second clock adjustment tuner provide coarser adjustments than the third clock adjustment tuner, wherein the first clock adjustment tuner receives a first control signal to control the first clock adjustment tuner, wherein the second clock adjustment tuner receives a second control signal to control the second clock adjustment tuner, and wherein the third clock adjustment tuner is to further receives a third control signal and a fourth control signal to control the third clock adjustment tuner.

8. The method of claim 7, wherein the first control signal provides a thermometer code and the second control signal provides a thermometer code.

9. The method of claim 7, wherein the third clock adjustment tuner provides a first fine adjustment associated with inverting the synchronized clock signal and a second fine adjustment associated with an output of the inverted synchronized clock signal.

* * * * *